United States Patent
Lin et al.

(10) Patent No.: US 12,029,130 B2
(45) Date of Patent: Jul. 2, 2024

(54) PIEZOELECTRIC BIOSENSOR AND RELATED METHOD OF FORMATION

(71) Applicant: Taiwan Semiconductor Manufacturing Company, Ltd., Hsin-Chu (TW)

(72) Inventors: Ching-Hui Lin, Taichung (TW); Chun-Ren Cheng, Hsin-Chu (TW); Shih-Fen Huang, Jhubei (TW); Fu-Chun Huang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/880,773

(22) Filed: Aug. 4, 2022

(65) Prior Publication Data

US 2022/0376164 A1 Nov. 24, 2022

Related U.S. Application Data

(62) Division of application No. 16/421,810, filed on May 24, 2019, now Pat. No. 11,588,095.

(60) Provisional application No. 62/738,665, filed on Sep. 28, 2018.

(51) Int. Cl.
| | |
|---|---|
| *H01L 41/113* | (2006.01) |
| *G01N 27/414* | (2006.01) |
| *H10N 30/05* | (2023.01) |
| *H10N 30/08* | (2023.01) |
| *H10N 30/30* | (2023.01) |
| *H10N 30/87* | (2023.01) |
| *H10N 30/88* | (2023.01) |

(52) U.S. Cl.
CPC ....... *H10N 30/302* (2023.02); *G01N 27/4141* (2013.01); *H10N 30/05* (2023.02); *H10N 30/08* (2023.02); *H10N 30/878* (2023.02); *H10N 30/88* (2023.02)

(58) Field of Classification Search
CPC ....... H01L 41/27; H01L 41/33; H01L 41/1132
See application file for complete search history.

(56) References Cited

U.S. PATENT DOCUMENTS

| | | | | |
|---|---|---|---|---|
| 4,636,827 A | * | 1/1987 | Rudolf | G01N 27/414 |
| | | | | 257/253 |
| 6,111,280 A | * | 8/2000 | Gardner | G01N 27/128 |
| | | | | 257/253 |
| 9,239,313 B2 | * | 1/2016 | Fife | G01N 27/4148 |

(Continued)

OTHER PUBLICATIONS

Notice of Allowance dated Oct. 13, 2022 for U.S. Appl. No. 16/421,810.

(Continued)

*Primary Examiner* — Jarrett J Stark
(74) *Attorney, Agent, or Firm* — Eschweiler & Potashnik, LLC

(57) ABSTRACT

In some embodiments, a piezoelectric biosensor is provided. The piezoelectric biosensor includes a semiconductor substrate. A first electrode is disposed over the semiconductor substrate. A piezoelectric structure is disposed on the first electrode. A second electrode is disposed on the piezoelectric structure. A sensing reservoir is disposed over the piezoelectric structure and exposed to an ambient environment, where the sensing reservoir is configured to collect a fluid comprising a number of bio-entities.

20 Claims, 6 Drawing Sheets

(56) References Cited

U.S. PATENT DOCUMENTS

| | | | | |
|---|---|---|---|---|
| 9,841,398 B2* | 12/2017 | Bustillo | ............ | G01N 27/4148 |
| 9,995,708 B2* | 6/2018 | Fife | ............ | G01N 27/4145 |
| 10,640,368 B2* | 5/2020 | Hu | ............ | B81B 3/0081 |
| 11,002,704 B2* | 5/2021 | Chen | ............ | H01L 29/0649 |
| 2005/0129573 A1* | 6/2005 | Gabriel | ............ | B82Y 10/00 |
| | | | | 436/133 |
| 2006/0055392 A1* | 3/2006 | Passmore | ............ | B82Y 15/00 |
| | | | | 324/71.1 |
| 2006/0263255 A1* | 11/2006 | Han | ............ | B82Y 30/00 |
| | | | | 422/83 |
| 2007/0048180 A1* | 3/2007 | Gabriel | ............ | B82Y 15/00 |
| | | | | 422/400 |
| 2007/0048181 A1* | 3/2007 | Chang | ............ | B82Y 15/00 |
| | | | | 422/400 |
| 2007/0132043 A1* | 6/2007 | Bradley | ............ | G01N 27/4146 |
| | | | | 257/414 |
| 2008/0021339 A1* | 1/2008 | Gabriel | ............ | A61B 5/097 |
| | | | | 422/400 |
| 2008/0093226 A1* | 4/2008 | Briman | ............ | G01N 33/0062 |
| | | | | 204/406 |
| 2008/0221806 A1* | 9/2008 | Bryant | ............ | B82Y 30/00 |
| | | | | 422/198 |
| 2017/0186940 A1* | 6/2017 | Bevilacqua | ............ | H10N 30/88 |
| 2019/0245515 A1* | 8/2019 | Hurwitz | ............ | H03H 3/02 |
| 2021/0036215 A1* | 2/2021 | Fragkiadakis | ............ | B41J 2/1628 |
| 2021/0061647 A1* | 3/2021 | Chen | ............ | B81C 1/00341 |

OTHER PUBLICATIONS

BioTek "PowerWave HT: Microplate Spectrophotometer." The date of publication is unknown, retrieved online on May 24, 2019 from https://www.biotek.com/products/detection-microplate-readers/powerwave-ht-microplate-spectrophotometer/.

Thermo Fischer Scientific. "GENESYS 30 Visible Spectrophotometer." The date of publication is unknown. Retrieved online on May 24, 2019 from: https://www.thermofisher.com/order/catalog/product/840-277000.

Non-Final Office Actiobn dated Jun. 29, 2022 for U.S. Appl. No. 16/421,810.

* cited by examiner

PIEZOELECTRIC BIOSENSOR AND RELATED METHOD OF FORMATION

REFERENCE TO RELATED APPLICATIONS

This Application is a Divisional of U.S. application Ser. No. 16/421,810, filed on May 24, 2019, which claims the benefit of U.S. Provisional Application No. 62/738,665, filed on Sep. 28, 2018. The contents of the above-referenced Patent Applications are hereby incorporated by reference in their entirety.

BACKGROUND

Biosensors are devices for sensing and detecting bio-entities, and typically operate on the basis of electronic, chemical, optical, or mechanical detection principles. Detection can be performed by detecting the bio-entities themselves, or through interaction and reaction between specified reactants and the bio-entities. Biosensors are widely used in different life-science applications, ranging from environmental monitoring and basic life science research to Point-of-Care (PoC) in-vitro molecular diagnostics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
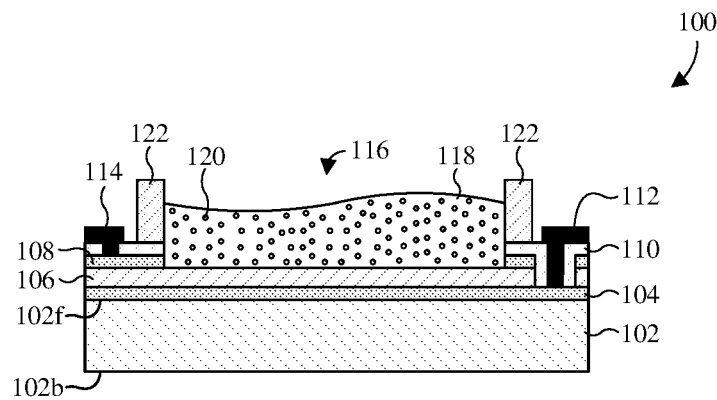
FIG. 1 illustrates a cross-sectional view of some embodiments of a piezoelectric biosensor.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some biosensors analyze a sample by passing radiation through the sample and measuring an amount of radiation absorbed by the sample. One example of such a biosensor is a spectrophotometer. Some spectrophotometers analyze a sample by comparing light transmittance of a blank sample comprising a bio-entity (e.g., a sample that does not contain a coloring agent) to light transmittance of a colored sample comprising a bio-entity (e.g., a sample containing a coloring agent). By comparing the light transmittance of the blank sample to the light transmittance of the colored sample, certain properties of the colored/blank sample may be determined.

One challenge with the above biosensors is manufacturing/operating costs. The above biosensors require components (e.g., light emitting devices, beam splitters, light detectors, etc.) that are expensive to manufacture. Further, analyzing a sample with the above biosensors is time intensive due to the need to run multiple samples (e.g., blank and colored) through time intensive bio-testing procedures, thereby increasing the cost to analyze the sample. In addition, the above biosensors are typically enclosed in a large housing that hinders the use of the above biosensors in Point-of-Care (PoC) applications, thereby further increasing the cost to analyze the sample.

In various embodiments, the present application is directed toward a piezoelectric biosensor. The piezoelectric biosensor comprises a piezoelectric structure disposed between a first electrode and a second electrode, where the first electrode is disposed over a semiconductor substrate. A sensing reservoir configured to collect a fluid comprising a number of bio-entities is disposed over the piezoelectric structure. The piezoelectric biosensor is configured to analyze a specific property of the bio-entities (e.g., detecting bio-entity growth in the fluid, detecting neurotransmission activity between bio-entities in the fluid, etc.) in the sensing reservoir. In some embodiments, an electrical property (e.g., capacitance, voltage, etc.) of the piezoelectric biosensor varies as the number of bio-entities in the sensing reservoir varies. Thus, the piezoelectric biosensor may analyze the specific property of the bio-entities.

Because the piezoelectric biosensor is disposed on a semiconductor substrate, the cost to manufacture the piezoelectric biosensor may be less expensive than other types of biosensors (e.g., spectrophotometers, plate readers, etc.). In addition, because the piezoelectric biosensor is disposed on a semiconductor substrate, a form factor of the piezoelectric biosensor may be smaller than other types of biosensors. Thus, the piezoelectric biosensor may reduce the cost to analyze a sample by providing an inexpensive PoC biosensor application. Further, testing a sample (e.g., a fluid comprising a number of bio-entities) with the piezoelectric biosensor may be less time intensive than other types of biosensors due to the piezoelectric biosensor having a simplified bio-testing procedure (e.g., testing one sample to determine the specific property of the bio-entities). Thus, the piezoelectric biosensor may further reduce the cost to analyze a sample.

FIG. 1 illustrates a cross-sectional view of some embodiments of a piezoelectric biosensor 100.

As shown in FIG. 1, the piezoelectric biosensor 100 comprises a semiconductor substrate 102. The semiconductor substrate 102 has a front-side 102f, and a back-side 102b that is opposite the front-side 102f. In some embodiments, the semiconductor substrate 102 comprises any type of semiconductor body (e.g., monocrystalline silicon/CMOS bulk, silicon-germanium (SiGe), silicon on insulator (SOI), etc.). In further embodiments, the semiconductor substrate 102 may have a thickness (e.g., a distance between the front-side 102f and the back-side 102b) of about 750 micrometers (μm).

A first electrode 104 is disposed over the semiconductor substrate 102. In some embodiments, the first electrode 104 is disposed over the front-side 102f of the semiconductor substrate 102. In further embodiments, the first electrode 104 may comprise, for example, titanium (Ti), platinum (Pt), copper (Cu), gold (Au), aluminum (Al), zinc (Zn), tin (Sn), ruthenium (Ru), some other conductive material, or a combination of the foregoing. In other embodiments, the first electrode 104 may comprise, for example, titanium dioxide ($TiO_2$), a ruthenium oxide ($RuO_X$), indium tin oxide (ITO), some other metal based oxide, or a combination of the foregoing.

A piezoelectric structure 106 is disposed on the first electrode 104. In some embodiments, the piezoelectric structure 106 may comprise, for example, zinc oxide (ZnO), gallium nitride (GaN), lead zirconate titanate (PZT), some other piezoelectric material, or a combination of the foregoing.

A second electrode 108 is disposed on the piezoelectric structure 106. In some embodiments, the second electrode 108 comprises, for example, Ti, Pt, Cu, Au, Al, Zn, Sn, Ru, some other conductive material, or a combination of the foregoing. In other embodiments, the second electrode 108 may comprise, for example, $TiO_2$, $RuO_X$, ITO, some other metal based oxide, or a combination of the foregoing. In further embodiments, the second electrode 108 and the first electrode 104 comprise a same conductive material.

In some embodiments, a passivation layer 110 is disposed over the second electrode 108. In further embodiments, the passivation layer 110 extends through the second electrode 108 and the piezoelectric structure 106 to the first electrode 104. In further embodiments, the passivation layer 110 may comprise, for example, an oxide (e.g., silicon dioxide ($SiO_2$)), a nitride (e.g., silicon nitride (SiN)), an oxy-nitride (e.g., silicon oxy-nitride ($SiO_XN_Y$)), or the like. In yet further embodiments, the passivation layer 110 may comprise a metal based oxide (e.g., aluminum oxide ($Al_2O_3$)).

A first input/output (110) structure 112 (e.g., a pad, solder ball, etc.) is electrically coupled to the first electrode 104. In some embodiments, the first I/O structure 112 is disposed over the first electrode 104 and extends through the second electrode 108 and the piezoelectric structure 106 to contact the first electrode 104. In further embodiments, the passivation layer 110 separates the first I/O structure 112 from the piezoelectric structure 106 and the second electrode 108.

A second I/O structure 114 (e.g., a pad, solder ball, etc.) is electrically coupled to the second electrode 108. In some embodiments, the second I/O structure 114 is disposed over the second electrode 108 and extends through the passivation layer 110 to contact the second electrode 108. In further embodiments, the first I/O structure 112 and the second I/O structure 114 may comprise, for example, Ti, Au, Cu, Al, some other conductive material, or a combination of the foregoing. In further embodiments, the first I/O structure 112 and the second I/O structure 114 are configured to provide electrical connections from the first electrode 104 and the second electrode 108, respectively, to processing circuitry (not shown) (e.g., an external microprocessor, measurement circuitry, bias circuitry, etc.). In yet further embodiments, the processing circuitry may be disposed on a semiconductor substrate (not shown) that is discrete from the semiconductor substrate 102 in which the piezoelectric structure 106 is disposed over. In other embodiments, the processing circuitry may be disposed on a same semiconductor substrate 102 as the piezoelectric structure 106.

A sensing reservoir 116 is disposed over the piezoelectric structure 106. The sensing reservoir 116 is configured to collect a fluid 118 comprising a number of bio-entities 120 (e.g., cells, neurons, etc.). In some embodiments, a fluidic channel 122 is disposed on the passivation layer 110. The fluidic channel 122 is a structure that is configured to improve/direct a flow of the fluid 118 into the sensing reservoir 116. In further embodiments, the fluidic channel 122 may be spaced from both the first I/O structure 112 and the second I/O structure 114. In yet further embodiments, the fluidic channel 122 may comprise, for example, polysilicon, an oxide (e.g., $SiO_2$), a nitride (e.g., SiN), an oxy-nitride (e.g., $SiO_XN_Y$), or the like.

In some embodiments, the sensing reservoir 116 is defined by a top surface of the piezoelectric structure 106, opposite sidewalls of the second electrode 108, opposite sidewalls of the passivation layer 110, and opposite sidewalls of the fluidic channel 122. For example, a bottom of the sensing reservoir 116 is defined by the top surface of the piezoelectric structure 106, and sides of the sensing reservoir 116 are defined by the opposite sidewalls of the second electrode 108, the opposite sidewalls of the passivation layer 110, and the opposite sidewalls of the fluidic channel 122, respectively. In further embodiments, the opposite sidewalls of the second electrode 108, the opposite sidewalls of the passivation layer 110, and the opposite sidewalls of the fluidic channel 122 may be substantially aligned, respectively. In yet further embodiments, the sides of the sensing reservoir may be substantially vertical.

The piezoelectric biosensor 100 is configured to analyze a specific property of the bio-entities 120 (e.g., detecting bio-entity growth in the fluid, detecting neurotransmission activity between bio-entities in the fluid, etc.) in the sensing reservoir 116. For example, the piezoelectric biosensor 100 is configured to detect a number of bio-entities 120 in the sensing reservoir 116. In some embodiments, as a number of bio-entities 120 in the sensing reservoir 116 changes, a mechanical stress applied to the piezoelectric structure 106 will change, resulting in a change in an electric potential across the piezoelectric structure 106. The change in electric potential allows the piezoelectric biosensor 100 to detect the number of bio-entities 120 in the sensing reservoir 116 due to an electrical property (e.g., capacitance, voltage, etc.) of the piezoelectric biosensor 100 varying as the number of bio-entities 120 in the sensing reservoir 116 varies.

For example, in some embodiments, the piezoelectric structure 106 is configured to change its shape based on the number of bio-entities 120 in the sensing reservoir 116. For example, the piezoelectric structure 106 may have a first shape when zero bio-entities 120 are in the sensing reservoir 116, a second shape different than the first shape when one bio-entity 120 is disposed in the sensing reservoir, and a third shape different than the first and second shape when a plurality of bio-entities 120 are disposed in the sensing reservoir 116. In some embodiments, the piezoelectric structure 106 may change its shape based on the number of bio-entities 120 in the sensing reservoir 116 due to a mechanical stress exerted on the piezoelectric structure 106 varying as the number of bio-entities 120 in the fluid 118 varies. In further embodiments, the change in shape of the piezoelectric structure 106 may take the form of the piezoelectric structure 106 deflecting toward (or away from) the first electrode 104.

As the shape of the piezoelectric structure 106 changes, a value of the electrical property of the piezoelectric biosensor 100 varies. For example, when the shape of the piezoelectric structure 106 is the first shape, the biosensor may have a first potential between the first electrode 104 and the second electrode 108; when the shape of the piezoelectric structure 106 is the second shape, the biosensor may have a second potential between the first electrode 104 and the second electrode 108 different than the first potential; and when the shape of the piezoelectric structure 106 is the third shape, the biosensor may have a third potential between the first electrode 104 and the second electrode 108 different than the first and second potentials.

Accordingly, the piezoelectric biosensor 100 may analyze the specific property of the bio-entities 120 in the sensing reservoir 116 based on changes in the shape of the piezoelectric structure 106. For example, processing circuitry (not shown) may measure/detect the change in electrical potential of the piezoelectric biosensor 100 at predefined time intervals as the fluid 118 is in the sensing reservoir 116. In some embodiments, the processing circuitry may measure/detect the change in electrical potential of the piezoelectric biosensor 100 as a capacitance by providing a bias voltage to the first I/O structure 112 and measuring/detecting changes in the capacitance of the piezoelectric biosensor 100 via the second I/O structure 114 at the predefined time intervals. In further embodiments, the bias voltage may be between about 2 volts (V) and about 10 V. Based on the measured/detected capacitance at the predefined time intervals, the processing circuitry may determine the specific property of the bio-entities 120 in the sensing reservoir 116.

Because the piezoelectric biosensor 100 is disposed on the semiconductor substrate 102, a form factor of the piezoelectric biosensor 100 may be smaller than other types of biosensors (e.g., spectrophotometers, plate readers, etc.). Thus, the piezoelectric biosensor 100 may reduce the cost to analyze a sample by providing an inexpensive Point-of-Care (PoC) biosensor application. Further, testing a sample (e.g., the fluid 118 comprising the number of bio-entities 120) with the piezoelectric biosensor 100 may be less time intensive than the other types of biosensors due to the piezoelectric biosensor 100 having a simplified bio-testing procedure (e.g., testing one sample to determine the specific property of the bio-entities 120). Thus, the piezoelectric biosensor 100 may further reduce the cost to analyze a sample.

Figure 2:
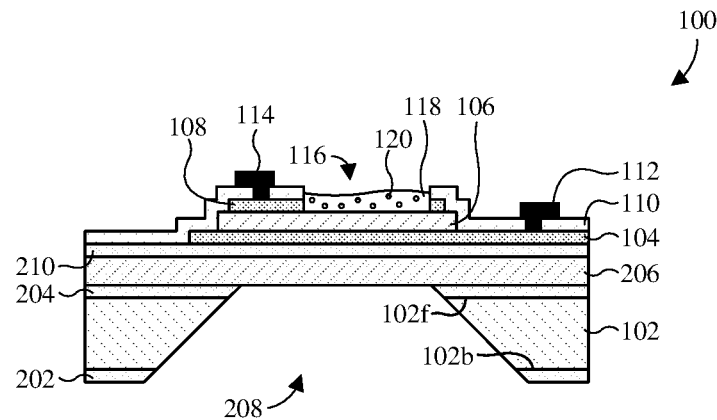
FIG. 2 illustrates some other embodiments of the piezoelectric biosensor of FIG. 1.

FIG. 2 illustrates some other embodiments of the piezoelectric biosensor 100 of FIG. 1.

As shown in FIG. 2, a first dielectric layer 202 is disposed on the back-side 102b of the semiconductor substrate 102. In some embodiments, the first dielectric layer 202 may comprise, for example, an oxide (e.g., $SiO_2$), a nitride (e.g., SiN), an oxy-nitride (e.g., $SiO_XN_Y$), or the like. In further embodiments, a second dielectric layer 204 is disposed on the front-side 102f of the semiconductor substrate 102. In further embodiments, the second dielectric layer 204 may comprise, for example, an oxide (e.g., $SiO_2$), a nitride (e.g., SiN), an oxy-nitride (e.g., $SiO_XN_Y$), or the like. In yet further embodiments, the first dielectric layer 202 and the second dielectric layer 204 may comprise a same material.

A structural support layer 206 may be disposed over the front-side 102f of the semiconductor substrate 102. In some embodiments, the structural support layer 206 is disposed on the second dielectric layer 204. In further embodiments, the structural support layer 206 provides structural support for overlying elements of the piezoelectric biosensor 100 (e.g., the first electrode 104, the piezoelectric structure 106, the second electrode 108, etc.). In yet further embodiments, the structural support layer 206 may comprise, for example, polysilicon.

In some embodiments, an opening 208 is disposed directly beneath the piezoelectric structure 106. The opening 208 is configured to reduce a stiffness of a portion of the piezoelectric biosensor 100 directly beneath the piezoelectric structure 106, such that the piezoelectric structure 106 may change its shape based on the number of bio-entities 120 in the sensing reservoir 116. In further embodiments, sides of the opening 208 extend into the semiconductor substrate 102 from the back-side 102b of the semiconductor substrate 102.

In some embodiments, the opening 208 is defined by a bottom surface of the structural support layer 206, opposite sidewalls of the second dielectric layer 204, opposite sidewalls of the semiconductor substrate 102, and opposite sidewalls of the first dielectric layer 202. For example, a top of the opening 208 may be defined by a bottom surface of the structural support layer 206, and sides of the opening 208 may be defined by the opposite sidewalls of the first dielectric layer 202, the opposite sidewalls of the semiconductor substrate 102, and the opposite sidewalls of the second dielectric layer 204, respectively. In further embodiments, the opposite sidewalls of the first dielectric layer 202, the opposite sidewalls of the semiconductor substrate 102, and the opposite sidewalls of the second dielectric layer 204 are substantially aligned, respectively.

In some embodiments, the sides of the opening 208 are sloped. For example, opposite sides of the opening 208 may slope toward one another from a bottom surface of the first dielectric layer 202 to the bottom surface of the structural support layer 206. In further embodiments, the opposite sidewalls of the first dielectric layer 202 may be spaced further apart than the opposite sidewalls of the semiconductor substrate 102. In yet further embodiments, the opposite sidewalls of the semiconductor substrate 102 may be spaced further apart than the opposite sidewalls of the second dielectric layer 204.

A third dielectric layer 210 may be disposed between the structural support layer 206 and the first electrode 104. In some embodiments, the third dielectric layer 210 contacts both the first electrode 104 and the structural support layer 206. In further embodiments, the third dielectric layer 210 may comprise, for example, an oxide (e.g., $SiO_2$), a nitride (e.g., SiN), an oxy-nitride (e.g., $SiO_XN_Y$), or the like. In yet further embodiments, the third dielectric layer 210 may comprise a same material as the first dielectric layer 202 and/or the second dielectric layer 204.

In some embodiments, outermost sidewalls of the second electrode 108 are disposed between outermost sidewalls of the piezoelectric structure 106. In further embodiments, the outermost sidewalls of the piezoelectric structure 106 are disposed between outermost sidewalls of the first electrode 104. In further embodiments, the passivation layer 110 may contact the second electrode 108, the piezoelectric structure 106, the first electrode 104, and the third dielectric layer 210.

In some embodiments, the first I/O structure 112 may be disposed on a first side of the sensing reservoir 116, and the second I/O structure 114 may be disposed on a second side of the sensing reservoir 116 opposite the first side of the sensing reservoir 116. In other embodiments, the first I/O structure 112 and the second I/O structure 114 may be disposed on a same side of the sensing reservoir 116. In further embodiments, the second I/O structure 114 may have an upper surface disposed over an upper surface of the first I/O structure 112. In other embodiments, the upper surface of the first I/O structure 112 may be about co-planar with the upper surface of the second I/O structure 114.

Figure 3:
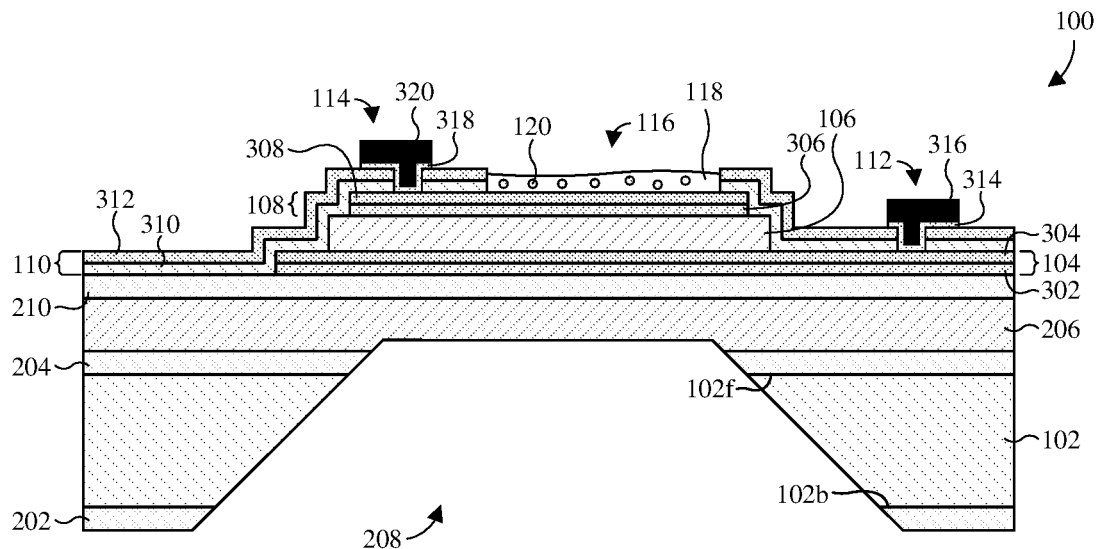
FIG. 3 illustrates some other embodiments of the piezoelectric biosensor of FIG. 1.

FIG. 3 illustrates some other embodiments of the piezoelectric biosensor 100 of FIG. 1.

As shown in FIG. 3, the opening 208 extends from the bottom surface of the first dielectric layer 202 into the structural support layer 206, such that a first bottom surface of the structural support layer 206 defines a top of the opening 208. In such embodiments, opposite sidewalls of the structural support layer 206 may be substantially aligned with the opposite sidewalls of the first dielectric layer 202, the opposite sidewalls of the semiconductor substrate 102, and the opposite sidewalls of the second dielectric layer 204, respectively. In further embodiments, the structural support layer 206 may have a second bottom surface that is disposed between the first bottom surface of the structural support layer 206 and the front-side 102f of the semiconductor substrate 102. In yet further embodiments, the second bottom surface may be disposed on opposite sides of the opening 208.

In some embodiments, the first electrode 104 comprises a first metal structure 304 disposed on a first adhesion structure 302. In further embodiments, the first adhesion structure 302 is disposed on the third dielectric layer 210. In further embodiments, the first adhesion structure 302 is configured to improve adhesion of the first electrode 104 to the third dielectric layer 210. In further embodiments, the first adhesion structure 302 comprises a metal based oxide, for example, titanium dioxide ($TiO_2$), a ruthenium oxide ($RuO_X$), indium tin oxide (ITO), some other metal based oxide, or a combination of the foregoing. In yet further embodiments, the first metal structure 304 comprises, for example, Ti, Pt, Cu, Au, Al, Zn, Sn, Ru, some other metal, or a combination of the foregoing.

In some embodiments, the second electrode 108 comprises a second metal structure 308 disposed on a second adhesion structure 306. In further embodiments, the second adhesion structure 306 is disposed on the piezoelectric structure 106. In further embodiments, the second adhesion structure 306 is configured to improve adhesion of the second electrode 108 to the piezoelectric structure 106. In further embodiments, the second adhesion structure 306 comprises a metal based oxide, for example, $TiO_2$, $RuO_X$, ITO, some other metal based oxide, or a combination of the foregoing. In further embodiments, the second metal structure 308 comprises, for example, Ti, Pt, Cu, Au, Al, Zn, Sn, Ru, some other metal, or a combination of the foregoing.

In some embodiments, the passivation layer 110 comprise a fifth dielectric layer 312 disposed on a fourth dielectric layer 310. In further embodiments, the fourth dielectric layer 310 is disposed on the third dielectric layer 210, the first electrode 104, the piezoelectric structure 106, and the second electrode 108. In further embodiments, the fourth dielectric layer 310 may have a higher dielectric constant than the fifth dielectric layer 312. For example, the fourth dielectric layer 310 may have a dielectric constant greater than 3.9 (e.g., a high-k dielectric), and the fifth dielectric layer 312 may have a dielectric constant less than or equal to 3.9 (e.g., $SiO_2$ and/or a low-k dielectric). In further embodiments, the fourth dielectric layer 310 may comprise a metal based oxide, for example, $Al_2O_3$. In yet further embodiments, the fifth dielectric layer 312 may comprise, for example, an oxide (e.g., $SiO_2$), a nitride (e.g., SiN), an oxy-nitride (e.g., silicon oxy-nitride ($SiO_XN_Y$), or the like.

In some embodiments, the first I/O structure 112 comprises a second conductive structure 316 disposed on a first conductive structure 314. In further embodiments, the first conductive structure 314 is disposed on the passivation layer 110 and the first electrode 104. In further embodiments, the first conductive structure 314 comprises, for example, Ti, Au, Pt, Al, some other conductive material, or a combination of the foregoing. In further embodiments, the second conductive structure 316 comprises, for example, Au, Ti, Pt, Al, some other conductive material, or a combination of the foregoing. In yet further embodiments, the first conductive structure 314 and the second conductive structure 316 comprise different materials.

In some embodiments, the second I/O structure 114 comprises a fourth conductive structure 320 disposed on a third conductive structure 318. In further embodiments, the third conductive structure 318 is disposed on the passivation layer 110 and the second electrode 108. In further embodiments, the third conductive structure 318 comprises, for example, Ti, Au, Pt, Al, some other conductive material, or a combination of the foregoing. In further embodiments, the fourth conductive structure 320 comprises, for example, Au, Ti, Pt, Al, some other conductive material, or a combination of the foregoing. In further embodiments, the third conductive structure 318 and the fourth conductive structure 320 comprise different materials. In further embodiments, the first conductive structure 314 and the third conductive structure 318 comprise a same material (e.g., Ti). In yet further embodiments, the second conductive structure 316 and the fourth conductive structure 320 comprise a same material (e.g., Pt).

FIGS. 4-14 illustrate a series of cross-sectional views of some embodiments of a method for forming the piezoelectric biosensor 100 of FIG. 3.

Figure 4:
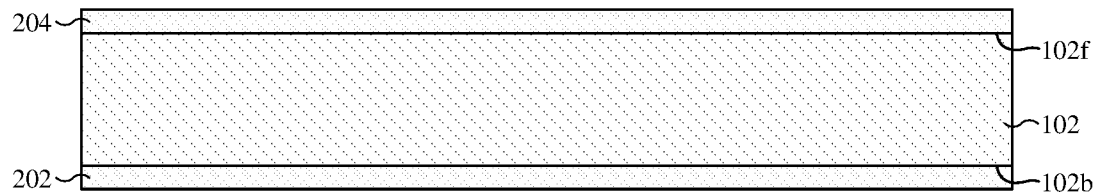
FIGS. 4-14 illustrate a series of cross-sectional views of some embodiments of a method for forming the piezoelectric biosensor of FIG. 3.

As shown in FIG. 4, a first dielectric layer 202 is formed on a back-side 102b of a semiconductor substrate 102. In some embodiments, a process forming the first dielectric layer 202 comprises depositing or growing the first dielectric layer 202 on the back-side 102b of the semiconductor substrate 102. In further embodiments, the first dielectric layer 202 may be deposited or grown by, for example, thermal oxidation, chemical vapor deposition (CVD), physical vapor deposition (PVD), atomic layer deposition (ALD), sputtering, some other deposition or growth process, or a combination of the foregoing.

Also shown in FIG. 4, a second dielectric layer 204 is formed on a front-side 102f of the semiconductor substrate 102. In some embodiments, a process forming the second dielectric layer 204 comprises depositing or growing the second dielectric layer 204 on the front-side 102f of the semiconductor substrate 102. In further embodiments, the second dielectric layer 204 may be deposited or grown by, for example, thermal oxidation, CVD, PVD, ALD, sputtering, some other deposition or growth process, or a combination of the foregoing.

In some embodiments, the first dielectric layer 202 and the second dielectric layer 204 may be formed at a same time by a single growth process. In further embodiments, before the first dielectric layer 202 and/or the second dielectric layer 204 are formed, a planarization process (e.g., mechanical grinding or chemical-mechanical planarization (CMP)) may be performed on the front-side 102f and/or the back-side 102b of the semiconductor substrate 102 to reduce a thickness of the semiconductor substrate 102 (e.g., a distance between the front-side 102f and the back-side 102b). In yet further embodiments, the thickness of the semiconductor substrate 102 may be reduced to below about 750 μm (e.g., to about 725 μm).

Figure 5:
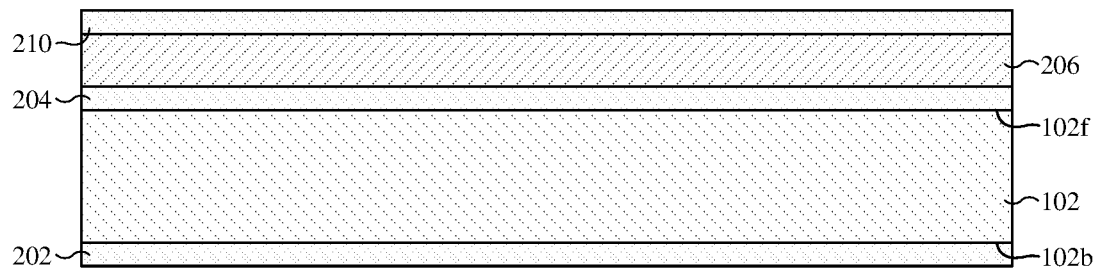

As shown in FIG. 5, a structural support layer 206 is formed over the second dielectric layer 204. In some embodiments, a process for forming the structural support layer 206 comprises depositing the structural support layer 206 on the second dielectric layer 204. In some embodiments, the structural support layer 206 may be deposited or grown by, for example, CVD, PVD, ALD, sputtering, molecular-beam epitaxy, some other deposition process, or a combination of the foregoing. In further embodiments, a planarization process (e.g., CMP) may be performed into the first dielectric layer 202 to remove excess material that may be deposited on the first dielectric layer 202 during formation of the structural support layer 206.

Also shown in FIG. 5, a third dielectric layer 210 is formed over the structural support layer 206. In some embodiments, a process for forming the third dielectric layer 210 comprises depositing or growing the third dielectric layer 210 on the structural support layer 206. In further embodiments, the third dielectric layer 210 may be deposited or grown by, for example, CVD, PVD, ALD, thermal oxidation, sputtering, some other deposition or growth process, or a combination of the foregoing. More specifically, in some embodiments, the third dielectric layer 210 may be deposited by plasma-enhanced chemical vapor deposition (PECVD).

Figure 6:
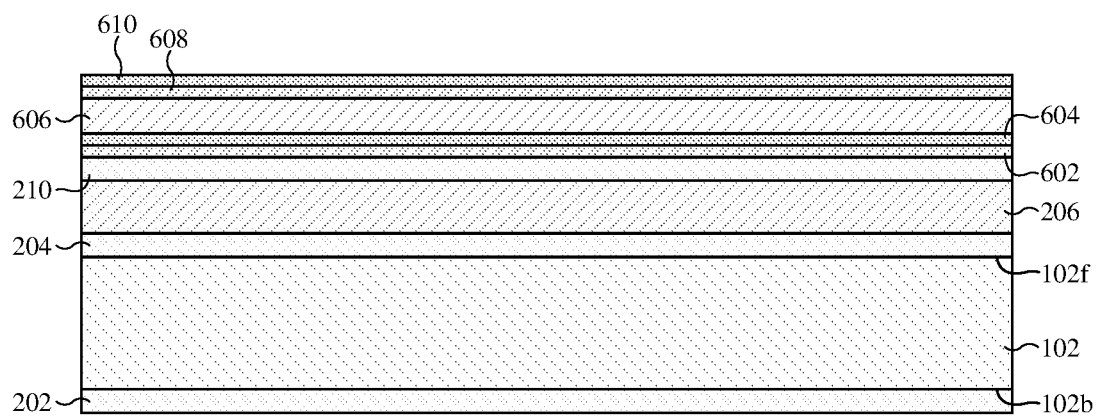

As shown in FIG. 6, a first adhesion layer 602 is formed over the third dielectric layer 210. In some embodiments, a process for forming the first adhesion layer 602 comprises depositing the first adhesion layer 602 on the third dielectric layer 210. In further embodiments, the first adhesion layer 602 may be deposited by, for example, CVD, PVD, ALD, sputtering, electrochemical plating, electroless plating, some other deposition process, or a combination of the foregoing. In yet further embodiments, the first adhesion layer 602 comprises a metal based oxide, for example, $TiO_2$, $RuO_X$, ITO, some other metal based oxide, or a combination of the foregoing. In further embodiments, the first adhesion layer 602 is configured to improve adhesion between a subsequently formed layer and the third dielectric layer 210.

Also shown in FIG. 6, a first metal layer 604 is formed over the first adhesion layer 602. In some embodiments, a process for forming the first metal layer 604 comprises depositing the first metal layer 604 on the first adhesion layer 602. In further embodiments, the first metal layer 604 may be deposited by, for example, CVD, PVD, ALD, sputtering, electrochemical plating, electroless plating, some other deposition process, or a combination of the foregoing. In yet further embodiments, the first metal layer 604 comprises, for example, Ti, Pt, Cu, Au, Al, Zn, Sn, Ru, some other metal, or a combination of the foregoing.

Also shown in FIG. 6, a piezoelectric layer 606 is formed over the first metal layer 604. In some embodiments, a process for forming the piezoelectric layer 606 comprises depositing or growing the piezoelectric layer 606 on the first metal layer 604. In further embodiments, the piezoelectric layer 606 may be deposited or grown by, for example, sputtering, a spin-on process, CVD, PVD, ALD, molecular-beam epitaxy, some other deposition or growth process, or a combination of the foregoing. In yet further embodiments, the piezoelectric layer 606 may comprise, for example, ZnO, GaN, PZT, some other piezoelectric material, or a combination of the foregoing.

Also shown in FIG. 6, a second adhesion layer 608 is formed over the piezoelectric layer 606. In some embodiments, a process for forming the second adhesion layer 608 comprises depositing the second adhesion layer 608 on the piezoelectric layer 606. In further embodiments, the second adhesion layer 608 may be deposited by, for example, CVD, PVD, ALD, sputtering, electrochemical plating, electroless plating, some other deposition process, or a combination of the foregoing. In yet further embodiments, the second adhesion layer 608 comprises a metal based oxide, for example, $TiO_2$, $RuO_X$, ITO, some other metal based oxide, or a combination of the foregoing. In further embodiments, the second adhesion layer 608 is configured to improve adhesion between a subsequently formed layer and the piezoelectric layer 606.

Also shown in FIG. 6, a second metal layer 610 is formed over the second adhesion layer 608. In some embodiments, a process for forming the second metal layer 610 comprises depositing the second metal layer 610 on the second adhesion layer 608. In further embodiments, the second metal layer 610 may be deposited by, for example, CVD, PVD, ALD, sputtering, electrochemical plating, electroless plating, some other deposition process, or a combination of the foregoing. In yet further embodiments, the second metal layer 610 comprises, for example, Ti, Pt, Cu, Au, Al, Zn, Sn, Ru, some other metal, or a combination of the foregoing.

Figure 7:
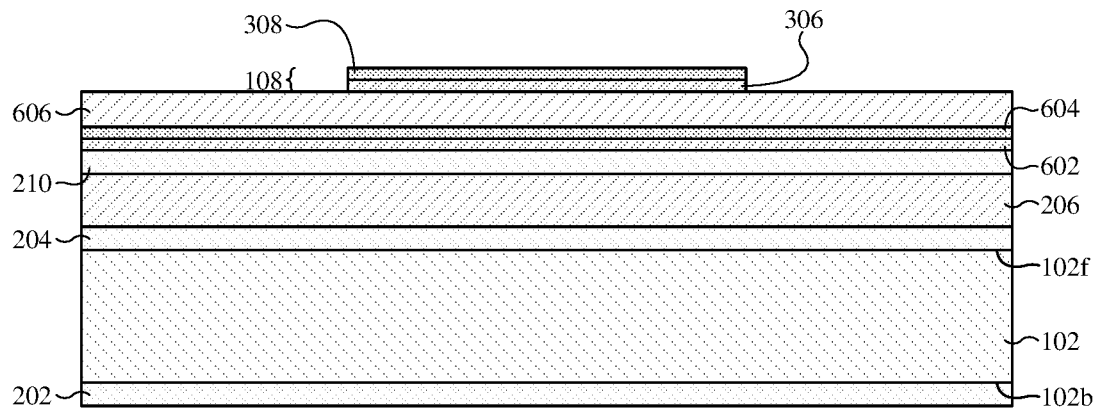

As shown in FIG. 7, a second electrode 108 is formed over the piezoelectric layer 606. In some embodiments, a process for forming the second electrode 108 comprises forming a masking layer (not shown) (e.g., a positive/negative photoresist) on the second metal layer 610 (see, e.g., FIG. 6). Thereafter, the second metal layer 610 and the second adhesion layer 608 (see, e.g., FIG. 6) are exposed to an etchant (e.g., a wet/dry etchant). The etchant removes unmasked portions of the second metal layer 610 and unmasked portions of the second adhesion layer 608 to form a second metal structure 308 and a second adhesion structure 306, respectively, thereby forming the second electrode 108. Subsequently, in some embodiments, the masking layer is stripped away.

Figure 8:
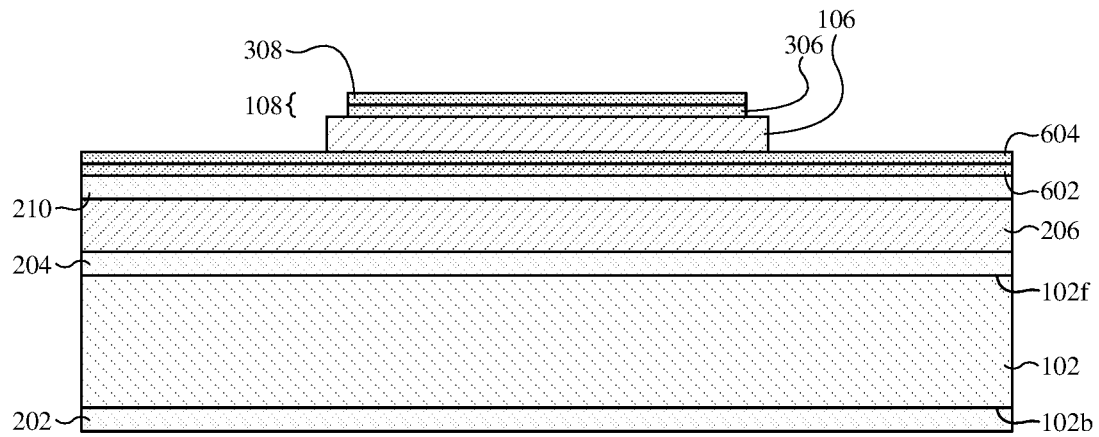

As shown in FIG. 8, a piezoelectric structure 106 is formed over the first metal layer 604. In some embodiments, a process for forming the piezoelectric structure 106 comprises forming a masking layer (not shown) on the piezoelectric layer 606 (see, e.g., FIG. 6) and on the second electrode 108. Thereafter, the piezoelectric layer 606 is exposed to an etchant (e.g., a wet/dry etchant) that removes unmasked portions of the piezoelectric layer 606, thereby forming the piezoelectric structure 106. Subsequently, in some embodiments, the masking layer is stripped away.

Figure 9:
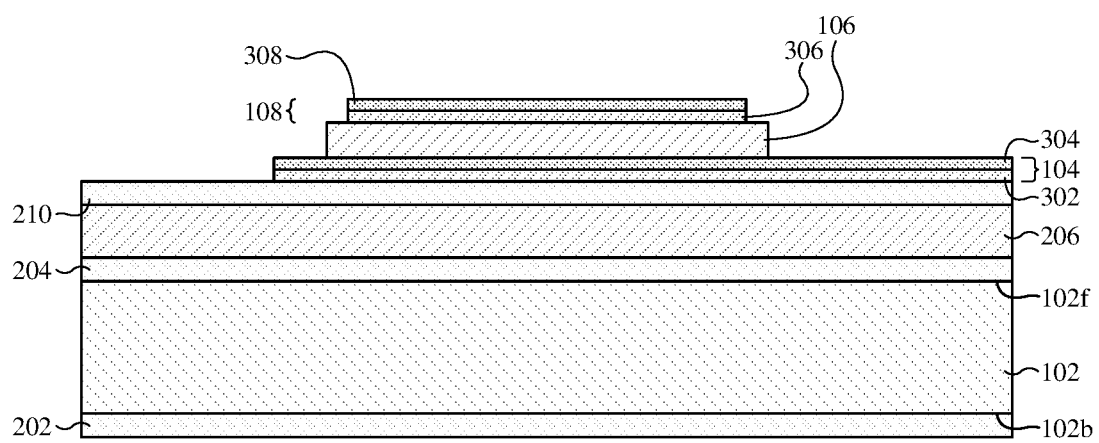

As shown in FIG. 9, a first electrode 104 is formed over the third dielectric layer 210. In some embodiments, a process for forming the first electrode 104 comprises forming a masking layer (not shown) on the first metal layer 604 (see, e.g., FIG. 6), the piezoelectric structure 106, and the second electrode 108. Thereafter, the first metal layer 604 and the first adhesion layer 602 (see, e.g., FIG. 6) are exposed to an etchant (e.g., a wet/dry etchant). The etchant removes unmasked portions of the first metal layer 604 and unmasked portions of the first adhesion layer 602 to form a first metal structure 304 and a first adhesion structure 302, respectively, thereby forming the first electrode 104. Subsequently, in some embodiments, the masking layer is stripped away.

Figure 10:
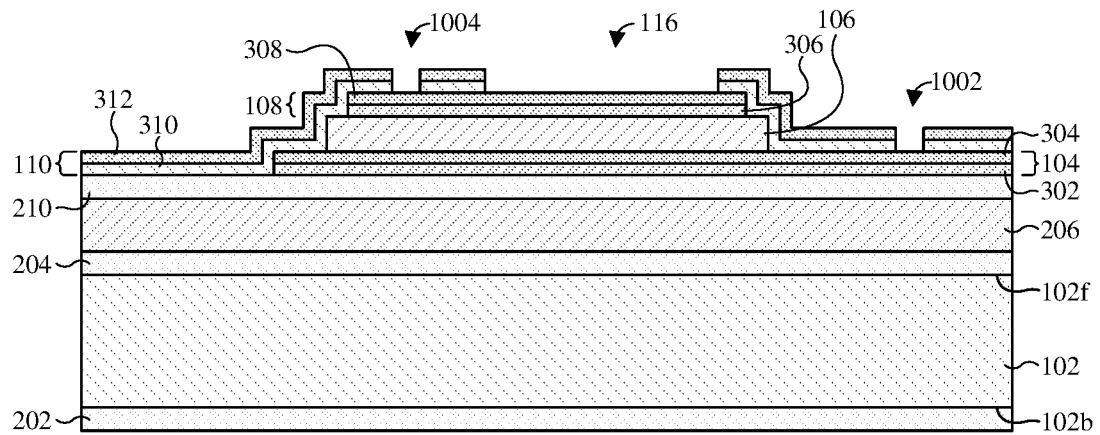

As shown in FIG. 10, a passivation layer 110 is formed over the third dielectric layer 210, the first electrode 104, the piezoelectric structure 106, and the second electrode 108. In some embodiments, a process for forming the passivation layer 110 comprises depositing a fourth dielectric layer 310 covering the third dielectric layer 210, the first electrode 104, the piezoelectric structure 106, and the second electrode 108. A fifth dielectric layer 312 is then deposited covering the fourth dielectric layer 310.

Thereafter, a masking layer (not shown) is formed on the fifth dielectric layer 312. Subsequently, the fifth dielectric layer 312 and the fourth dielectric layer 310 are exposed to an etchant (e.g., a wet/dry etchant). The etchant removes unmasked portions of the fifth dielectric layer 312 and unmasked portions of the fourth dielectric layer 310 to form a sensing reservoir 116 over the second electrode 108; a first I/O structure opening 1002 over the first electrode 104; and a second I/O structure opening 1004 over the second electrode 108, thereby forming the passivation layer 110. Subsequently, in some embodiments, the masking layer is stripped away. It will be appreciated that, in some embodiments, multiple etchants may be used to form the passivation layer 110. For example, a first etchant may remove unmasked portions of the fifth dielectric layer 312, and a second etchant different than the first etchant may remove unmasked portions of the fourth dielectric layer 310.

In some embodiments, the sensing reservoir 116 is formed between outermost sidewalls of the second electrode 108. In further embodiments, the first I/O structure opening 1002 is formed on a first side of the sensing reservoir 116. In further embodiments, the first I/O structure opening 1002 is formed extending through the passivation layer 110 from an upper surface of the fifth dielectric layer 312 to the first electrode 104. In further embodiments, the second I/O structure opening 1004 is formed on a second side of the sensing reservoir 116 opposite the first side. In further embodiments, the second I/O structure opening 1004 is formed extending through the passivation layer 110 from an upper surface of the fifth dielectric layer 312 to the second electrode 108. In yet further embodiments, the first I/O structure opening 1002 may be disposed beyond outermost sidewalls of the piezoelectric structure 106, while the second I/O structure opening 1004 may be disposed between the outermost sidewalls of the piezoelectric structure 106.

Figure 11:
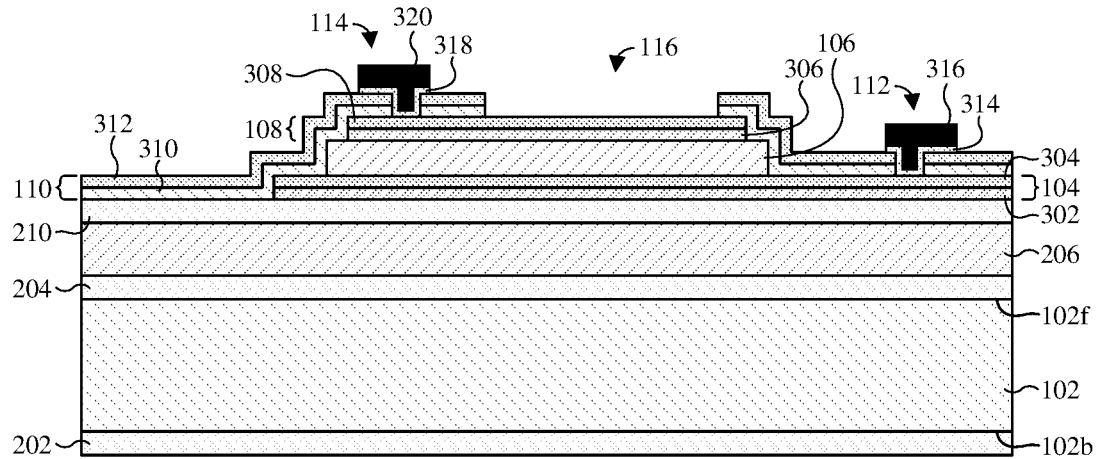

As shown in FIG. 11, a first I/O structure 112 is formed over the first electrode 104 and electrically coupled to the first electrode 104. In addition, a second I/O structure 114 is formed over the second electrode 108 and electrically coupled to the second electrode 108. In some embodiments, a process for forming the first I/O structure 112 and the second I/O structure 114 comprises depositing a first conductive layer (not shown) on the passivation layer 110, the first electrode 104, and the second electrode 108. In some embodiments, the first conductive layer lines the first I/O structure opening 1002, the second I/O structure opening 1004, and the sensing reservoir 116. In further embodiments, the first conductive layer may be deposited by, for example, CVD, PVD, ALD, sputtering, electrochemical plating, electroless plating, some other deposition process, or a combination of the foregoing. In yet further embodiments, the first conductive layer may comprise, for example, Ti, Au, Pt, Al, some other conductive material, or a combination of the foregoing.

A second conductive layer (not shown) is then deposited on the first conductive layer. In some embodiments, the second conductive layer fills the first I/O structure opening 1002, the second I/O structure opening 1004, and the sensing reservoir 116. In further embodiments, the second conductive layer may be deposited by, for example, CVD, PVD, ALD, sputtering, electrochemical plating, electroless plating, some other deposition process, or a combination of the foregoing. In further embodiments, the second conductive layer may comprise, for example, Ti, Au, Pt, Al, some other conductive material, or a combination of the foregoing. In yet further embodiments, the second conductive layer may comprise a different material than the first conductive layer. It will be appreciated that, in some embodiments, the first conductive layer and/or the second conductive layer may not be formed in the sensing reservoir 116. For example, a protective layer (not shown) (e.g., positive/negative photoresist) may be deposited covering the sensing reservoir prior to depositing the first conductive layer and/or the second conductive layer.

Thereafter, a masking layer (not shown) is formed on the first conductive layer. Subsequently, the first conductive layer is exposed to an etchant (e.g., a wet/dry etchant). The etchant removes unmasked portions of the second conductive layer to form a second conductive structure 316 and a fourth conductive structure 320, and removes unmasked portions of first conductive layer to form a first conductive structure 314 and a third conductive structure 318, thereby forming the first I/O structure 112 and the second I/O structure 114. Subsequently, in some embodiments, the masking layer is stripped away. It will be appreciated that, in some embodiments, multiple etchants may be used to form the first I/O structure 112 and the second I/O structure 114. For example, a first etchant may remove unmasked portions of the first conductive layer, and a second etchant different than the first etchant may remove unmasked portions of the second conductive layer.

In some embodiments, the first I/O structure 112 is formed on the first side of the sensing reservoir 116. In further embodiments, the first I/O structure 112 is formed extending through the passivation layer 110 from the upper surface of the fifth dielectric layer 312 to the first electrode 104. In further embodiments, the second I/O structure 114 is formed on the second side of the sensing reservoir 116 opposite the first side. In further embodiments, the second I/O structure 114 is formed extending through the passivation layer 110 from the upper surface of the fifth dielectric layer 312 to the second electrode 108. In yet further embodiments, the first I/O structure 112 may be disposed beyond the outermost sidewalls of the piezoelectric structure 106, while the second I/O structure 114 is disposed between the outermost sidewalls of the piezoelectric structure 106.

Figure 12:
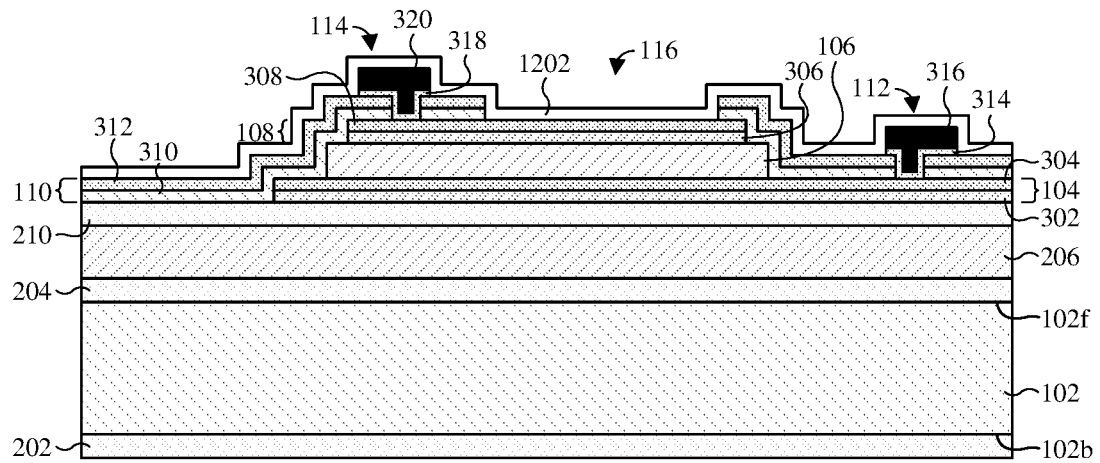

As shown in FIG. 12, a protective layer 1202 is formed covering the passivation layer 110, the first I/O structure 112, the second electrode 108, and the second I/O structure 114. The protective layer 1202 is configured to protect the passivation layer 110, the first I/O structure 112, the second electrode 108, and the second I/O structure 114 during a subsequent fabrication process(es). In some embodiments, a process for forming the protective layer 1202 comprises depositing the protective layer 1202 on the passivation layer 110, the first I/O structure 112, the second electrode 108, and the second I/O structure 114. In further embodiments, the protective layer 1202 may be deposited by, for example, a spin-on process, CVD, PVD, ALD, sputtering, some other deposition or growth process, or a combination of the foregoing. In yet further embodiments, the protective layer 1202 may comprise, for example, a photoresist (e.g., a negative/positive photoresist), a dielectric (e.g., $SiO_2$), a polymer, or the like.

Figure 13:
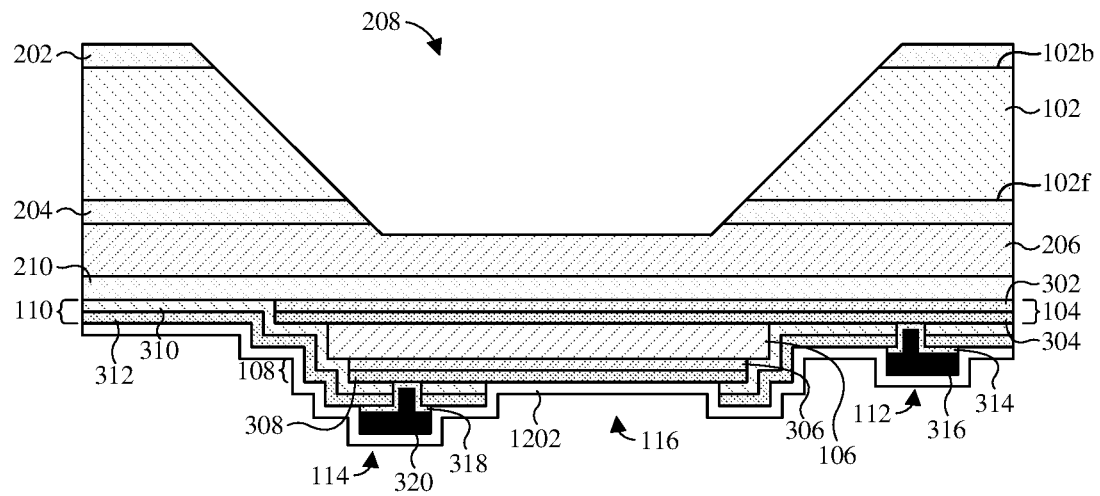

As shown in FIG. 13, an opening 208 is formed extending through the semiconductor substrate 102 from the first dielectric layer 202 to the structural support layer 206. In some embodiments, a process for forming the opening 208 comprises flipping the semiconductor substrate 102 (e.g., rotating 180 degrees), such that the back-side 102b of the semiconductor substrate 102 is facing an opposite direction than the back-side 102b of the semiconductor substrate 102 faces during formation of the protective layer 1202 (see, e.g., FIG. 12).

Thereafter, a masking layer (not shown) is formed on the first dielectric layer 202. Subsequently, the first dielectric layer 202, the semiconductor substrate 102, the second dielectric layer 204, and the structural support layer 206 are exposed to an etchant (e.g., a wet/dry etchant). In some embodiments, the etchant is a dry etchant utilized in a reactive-ion etching (RIE) system. The etchant removes unmasked portions of the first dielectric layer 202; unmasked portions of the semiconductor substrate 102; unmasked portions of the second dielectric layer 204; and unmasked portions of the structural support layer 206, thereby forming the opening 208. Subsequently, in some embodiments, the masking layer is stripped away.

In some embodiments, the opening 208 is formed with sloping sides. In further embodiments, the sloping sides of the opening 208 are formed such that opposite sloping sides of the opening 208 slope toward one another. In further embodiments, the sides of the opening 208 are formed such that the sides of the opening 208 extend into the structural support layer 206 by a non-zero distance. In other embodiments, the sides of the opening 208 may be formed such that the sides of the opening 208 do not extend into the structural support layer 206.

Figure 14:
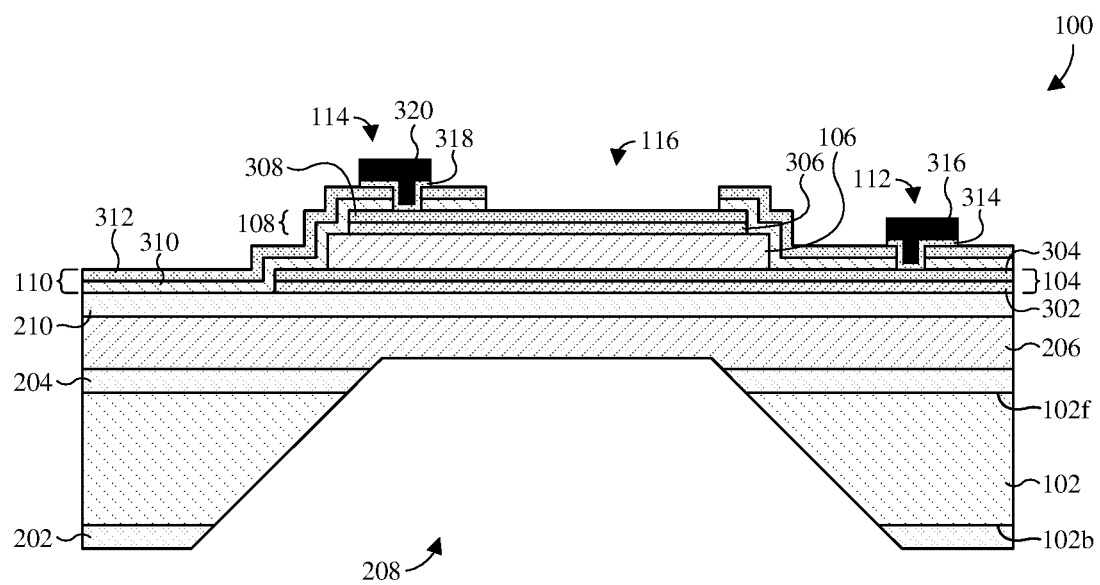

As shown in FIG. 14, the protective layer 1202 is removed. In some embodiments, a process for removing the protective layer 1202 comprises flipping the semiconductor substrate 102 (e.g., rotating 180 degrees), such that the back-side 102b of the semiconductor substrate 102 is facing an opposite direction than the back-side 102b of the semiconductor substrate 102 faces during formation of the opening 208 (see, e.g., FIG. 13). Thereafter, the protective layer 1202 may be removed. In some embodiments, the protective layer 1202 may be removed by, for example, plasma ashing, exposure to a stripping agent (e.g., a photoresist stripping solvent), or the like. In some embodiments, after the protective layer 1202 is removed, formation of the piezoelectric biosensor 100 is complete. Because the piezoelectric biosensor 100 is formed on the semiconductor substrate 102, a cost to manufacture the piezoelectric biosensor 100 may be less expensive than other types of biosensors (e.g., spectrophotometers, plate readers, etc.).

Figure 15:
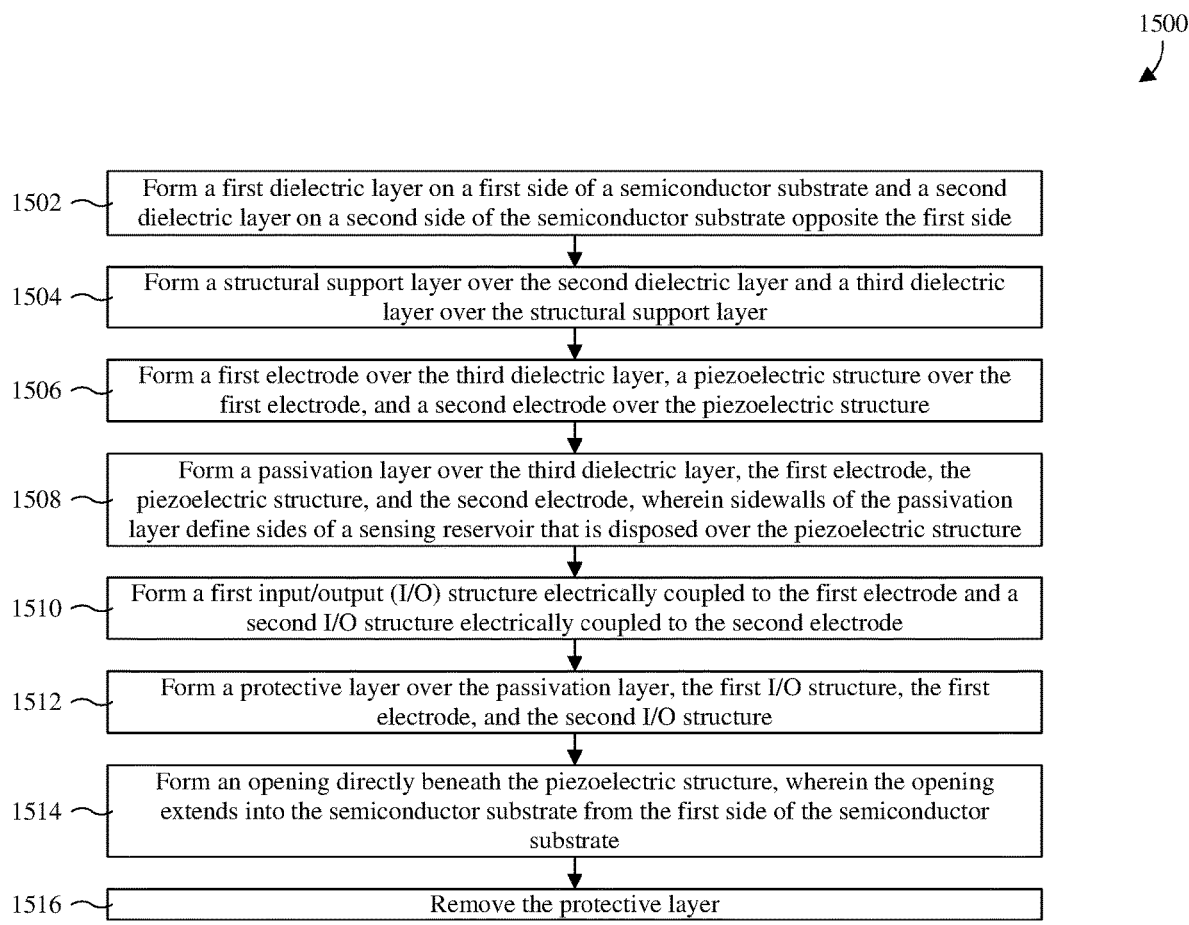
FIG. 15 illustrates a flowchart of some embodiments of a method for forming a piezoelectric biosensor.

As illustrated in FIG. 15, a flowchart 1500 of some embodiments of a method for forming a piezoelectric biosensor is provided. While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1502, a first dielectric layer is formed on a first side of a semiconductor substrate, and a second dielectric layer is formed on a second side of the semiconductor substrate opposite the first side. FIG. 4 illustrates a cross-sectional view of some embodiments corresponding to act 1502.

At 1504, a structural support layer is formed over the second dielectric layer, and a third dielectric layer is formed over the structural support layer. FIG. 5 illustrates a cross-sectional view of some embodiments corresponding to act 1504.

At 1506, a first electrode is formed over the third dielectric layer, a piezoelectric structure is formed over the first electrode, and a second electrode is formed over the piezoelectric structure. FIGS. 6-9 illustrate a series of cross-sectional views of some embodiments corresponding to act 1506.

At 1508, a passivation layer is formed over the third dielectric layer, the first electrode, the piezoelectric structure, and the second electrode, wherein sidewalls of the passivation layer define sides of a sensing reservoir that is disposed over the piezoelectric structure. FIG. 10 illustrates a cross-sectional view of some embodiments corresponding to act 1508.

At 1510, a first input/output (I/O) structure is formed electrically coupled to the first electrode, and a second I/O structure is formed electrically coupled to the second electrode. FIG. 11 illustrates a cross-sectional view of some embodiments corresponding to act 1510.

At 1512, a protective layer is formed over the passivation layer, the first I/O structure, the first electrode, and the second I/O structure. FIG. 12 illustrates a cross-sectional view of some embodiments corresponding to act 1512.

At 1514, an opening is formed directly beneath the piezoelectric structure, wherein the opening extends into the semiconductor substrate from the first side of the semiconductor substrate. FIG. 13 illustrates a cross-sectional view of some embodiments corresponding to act 1514.

At 1516, the protective layer is removed. FIG. 14 illustrates a cross-sectional view of some embodiments corresponding to act 1516.

In some embodiments, the present application provides a piezoelectric biosensor. The piezoelectric biosensor comprises a semiconductor substrate. A first electrode is disposed over the semiconductor substrate. A piezoelectric structure is disposed on the first electrode. A second electrode is disposed on the piezoelectric structure. A sensing reservoir is disposed over the piezoelectric structure and exposed to an ambient environment, where the sensing reservoir is configured to collect a fluid comprising a number of bio-entities.

In other embodiments, the present application provides a piezoelectric biosensor. The piezoelectric biosensor comprises a structural support layer that is disposed over a first side of a semiconductor substrate. A first electrode is disposed over the structural support layer. A piezoelectric structure is disposed on the first electrode. A second electrode is disposed on the piezoelectric structure. A passivation layer is disposed over the piezoelectric structure and has opposite sidewalls that define sides of a sensing reservoir, where the sensing reservoir is configured to receive a fluid comprising a number of bio-entities. Sidewalls of the semiconductor substrate, which extend between the first side of the semiconductor substrate and an opposing second side of the semiconductor substrate, define an opening that is disposed directly below the piezoelectric structure. Further, the opening is defined by a first bottom surface of the structural support layer.

In yet other embodiments, the present application provides a method for forming a piezoelectric biosensor. The method comprises forming a first electrode over a first side of a semiconductor substrate. A piezoelectric structure is formed on the first electrode. A second electrode is formed on the piezoelectric structure. A passivation layer is formed on the second electrode, the piezoelectric structure, and the first electrode. A sensing reservoir is formed over the piezoelectric structure, where forming the sensing reservoir comprises removing a portion of the passivation layer between outermost sidewalls of the second electrode. An opening is formed directly below the piezoelectric structure, where the opening extends into the semiconductor substrate from a second side of the semiconductor substrate opposite the first side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A piezoelectric biosensor, comprising:
a semiconductor substrate;
a first electrode disposed over the semiconductor substrate;
a piezoelectric structure disposed on the first electrode;
a second electrode disposed on the piezoelectric structure; and
a sensing reservoir disposed over the piezoelectric structure and exposed to an ambient environment, the sensing reservoir configured to collect a fluid comprising a number of bio-entities;
wherein the piezoelectric structure comprises piezoelectric material continuously from the first electrode to the second electrode in a direction orthogonal to a surface of the semiconductor substrate, which faces away from the first and second electrodes.

2. The piezoelectric biosensor of claim 1, further comprising:
a passivation layer disposed on the second electrode, wherein opposite sidewalls of the passivation layer define sides of the sensing reservoir.

3. The piezoelectric biosensor of claim 2, wherein a bottom surface of the passivation layer directly contacts a top surface of the first electrode.

4. The piezoelectric biosensor of claim 3, wherein a sidewall of the passivation layer directly contacts a sidewall of the first electrode.

5. The piezoelectric biosensor of claim 4, wherein the sides of the sensing reservoir are substantially vertical.

6. The piezoelectric biosensor of claim 2, wherein the sides of the sensing reservoir are further defined by opposite sidewalls of the second electrode.

7. The piezoelectric biosensor of claim 6, wherein the opposite sidewalls of the passivation layer are substantially aligned with the opposite sidewalls of the second electrode, respectively.

8. The piezoelectric biosensor of claim 7, wherein the sides of the sensing reservoir are substantially vertical.

9. The piezoelectric biosensor of claim 8, wherein a bottom surface of the passivation layer directly contacts a top surface of the first electrode.

10. The piezoelectric biosensor of claim 9, wherein a sidewall of the passivation layer directly contacts a sidewall of the first electrode.

11. A piezoelectric biosensor, comprising:
a structural support layer disposed over a first side of a semiconductor substrate;
a first electrode disposed over the structural support layer;
a piezoelectric structure disposed on the first electrode;
a second electrode disposed on the piezoelectric structure;
a passivation layer disposed over the piezoelectric structure and having opposite sidewalls defining sides of a sensing reservoir configured to receive a fluid comprising a number of bio-entities; and
wherein sidewalls of the semiconductor substrate, which extend between the first side of the semiconductor substrate and an opposing second side of the semiconductor substrate, define an opening disposed directly below the piezoelectric structure, and wherein the opening is further defined by a first bottom surface of the structural support layer.

12. The piezoelectric biosensor of claim 11, wherein the second electrode further has opposite sidewalls defining the sides of the sensing reservoir, and wherein the opposite sidewalls of the second electrode are edge to edge respectively with the opposite sidewalls of the passivation layer.

13. The piezoelectric biosensor of claim 11, wherein a top surface of the piezoelectric structure defines a bottom of the sensing reservoir.

14. The piezoelectric biosensor of claim 11, wherein outermost sidewalls of the second electrode are disposed between outermost sidewalls of the piezoelectric structure, and wherein the outermost sidewalls of the piezoelectric structure are disposed between outermost sidewalls of the first electrode.

15. The piezoelectric biosensor of claim 11, wherein sides of the opening are sloped, the sides of the opening extending from the second side of the semiconductor substrate to the first bottom surface of the structural support layer.

16. The piezoelectric biosensor of claim 15, wherein the structural support layer has a second bottom surface that is disposed between the first bottom surface of the structural support layer and the first side of the semiconductor substrate, and wherein opposite sidewalls of the structural support layer further define the sides of the opening.

17. The piezoelectric biosensor of claim 16, further comprising:
a first dielectric layer disposed between the structural support layer and the semiconductor substrate, wherein opposite sidewalls of the first dielectric layer further define the sides of the opening.

18. The piezoelectric biosensor of claim 17, further comprising:
a second dielectric layer disposed on the second side of the semiconductor substrate, wherein opposite sidewalls of the second dielectric layer further define the sides of the opening.

19. The piezoelectric biosensor of claim 18, wherein the opposite sidewalls of the second dielectric layer are spaced further apart than the opposite sidewalls of the structural support layer.

20. A biosensor, comprising:
- a semiconductor substrate;
- a first electrode structure disposed over the semiconductor substrate;
- a piezoelectric structure overlying the first electrode structure;
- a second electrode structure overlying the piezoelectric structure and the first electrode structure;
- a sensing reservoir overlying the piezoelectric structure and the first electrode structure, wherein the sensing reservoir is configured to collect a fluid comprising a number of bio-entities;
- a first conductive structure electrically coupled to the first electrode structure, wherein the first conductive structure overlies the first electrode structure, and wherein the first conductive structure is laterally spaced from the piezoelectric structure; and
- a second conductive structure electrically coupled to the second electrode structure, wherein the second conductive structure overlies the second electrode structure and the piezoelectric structure, and wherein the sensing reservoir is disposed laterally between the first conductive structure and the second conductive structure.

* * * * *